United States Patent [19]

Jacobson

[11] 4,203,033
[45] May 13, 1980

[54] RADIATION ENERGY CALIBRATING SYSTEM AND METHOD

[76] Inventor: Arnold F. Jacobson, 1141 Petra Pl., Madison, Wis. 53713

[21] Appl. No.: 21,263

[22] Filed: Mar. 16, 1979

[51] Int. Cl.² ............................................. G01D 18/00
[52] U.S. Cl. ................................... 250/252; 250/355
[58] Field of Search .............. 250/252, 354, 355, 401

[56] References Cited

U.S. PATENT DOCUMENTS

| | | | |
|---|---|---|---|
| 4,028,554 | 6/1977 | Hounsfield | 250/252 |
| 4,034,222 | 7/1977 | Azam et al. | 250/355 |
| 4,096,575 | 6/1978 | Itoh | 250/252 |
| 4,097,736 | 6/1978 | Jacobson et al. | 250/252 |
| 4,121,104 | 10/1978 | Richter | 250/355 |

*Primary Examiner*—Davis L. Willis
*Attorney, Agent, or Firm*—Alter & Weiss

[57] ABSTRACT

A radiation energy calibrating system and method which uses a pair of calibrated detectors for measurements of radiation intensity from X-ray tubes for a non-invasive determination of the electrical characteristics; i.e., the tube potential and/or current.

8 Claims, 3 Drawing Figures

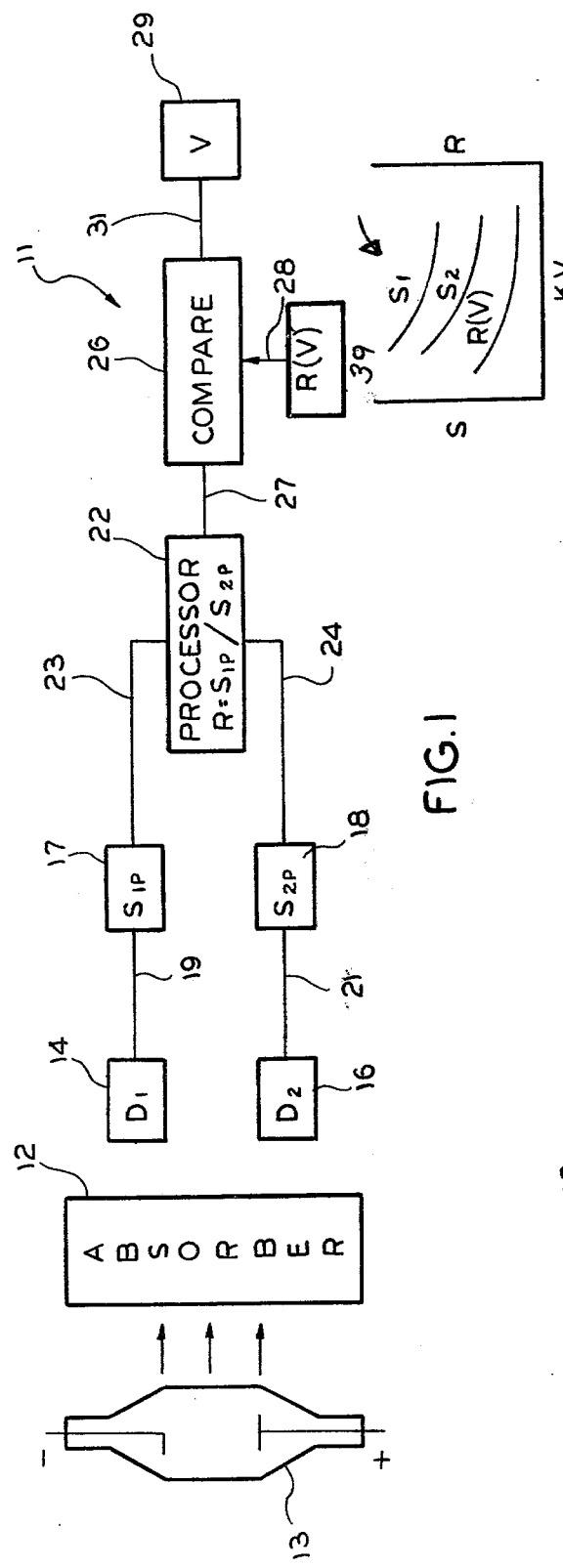
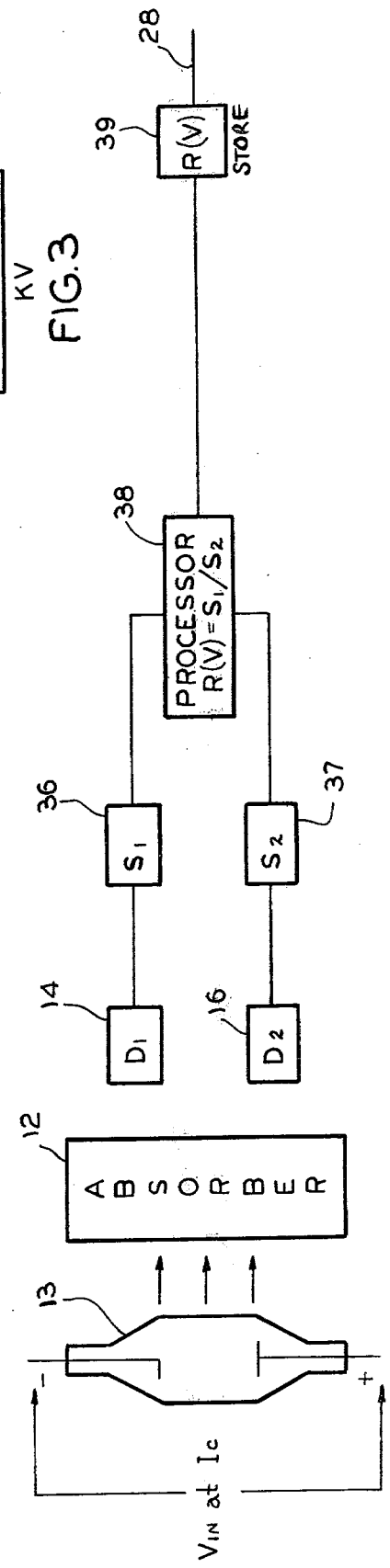
FIG.1
FIG.2
FIG.3

RADIATION ENERGY CALIBRATING SYSTEM AND METHOD

This invention is concerned with the calibration of the energy of radiation from a given source, such as an X-ray tube; and more particularly, with determining the electrical characteristics of X-ray generators from measurements of the radiation emitted.

This invention is an improvement over a prior RADIATION ENERGY CALIBRATING DEVICE AND METHOD covered by U.S. Pat. No. 4,097,736 filed by me and my co-inventor on Feb. 14, 1977, which issued on June 27, 1978 and is assigned to Radnovation Inc. That prior patent points out the necessity and importance of precise calibration of radiation sources. In the invention of U.S. Pat. No. 4,097,736, the maximum or peak radiation intensity produced by an X-ray generator is used to infer the value of the peak tube potential applied to the X-ray tube.

A simplified description of that invention envisions the use of a multiplicity of identical detectors to detect the radiation transmitted through a plurality of different absorber thicknesses. The variation in radiation intensity with absorber thickness provides a measure of the calibration of the X-ray generator. Therefore, the method and means of U.S. Pat. No. 4,097,736 depend upon an accurate knowledge of the attenuation properties of the radiation absorbers used.

Thus, that invention ideally uses a series of identical detectors and different filter thicknesses with the criterion that the filters used provide much greater filtration than the inherent filtration of the X-ray tube.

It is recognized that alternative calibration systems and procedures would be beneficial.

Accordingly, an object of the present invention is to provide calibration methods and equipment having advantages over the methods and equipment delineated in the noted patent.

A related object of the present invention is to provide radiation calibrating systems using at least two distinct radiation detectors having different energy response functions.

Another related object of the present invention is to provide radiation energy calibration equipment utilizing an absorber having a much greater filtration characteristic than the total combined filtration inherent in the radiation source assemblies; i.e., X-ray tubes, tube housings and beam limiting devices.

Yet another object of the present invention is to provide X-ray source calibration equipment using a single absorber and a pair of detectors having distinct characteristics.

Yet another object of the present invention is to have the equipment automatically compute the ratio of the peak signals determined by two distinct detectors.

Still another object of the present invention is to provide equipment to automatically compute the ratio of signals determined by distinct detectors at any time during radiation exposure; i.e., not limited to peak signals.

Yet another object of the present invention is to have these ratios compared to calibrated ratio functions, whereby a determination of the peak or the instantaneous voltage at any time during the X-ray exposure is provided.

Yet another object of the present invention is to use the absolute response of either detector to calculate the peak tube current, the average tube current, or the instantaneous tube current.

Still another object of the present invention is to provide methods and systems that are highly sensitive over almost any voltage range.

These and other objects and features of the present invention will be best understood by making reference to the accompanying drawings; wherein:

FIG. 1 is a block diagram showing the essential portions of the invention and functional equipment for accomplishing the invention;

FIG. 2 is a block diagram showing the essential functional equipment used for calibrating detector D1 and D2 of FIG. 1 to obtain R(V); and FIG. 3 is a graphical showing of the ratio function R(V) and of the detector characteristic functions S1 and S2.

The improved calibrating equipment is shown as 11 and it includes a single filter or absorber 12 for filtering the X-rays produced by the X-ray tube 13. The characteristics of the filter 12 are that its absorption is much greater than that produced by the absorbing materials present in the X-ray generating equipment.

Located on the other side of the filter 12 are shown a pair of detectors 14 and 16. A basic requirement of this system is that the response functions of the two detectors must be independent of each other; i.e., the two response functions must be different from each other. The accuracy of the calibration system increases as a function of the difference between the characteristics of the detectors 14 and 16. Each radiation detector 14 and 16 is coupled to an associated peak detector, shown as blocks 17 and 18, respectively. It should be understood that the necessary current to voltage converters are included in the blocks 17 and 18.

The blocks 17 and 18 are shown coupled to blocks 14 and 16 through conductors 19 and 21, respectively. The outputs of blocks 17 and 18 are shown attached to a ratio calculator 22 through conductors 23 and 24, respectively. The ratio calculator is a divider network which divides the output of the block 17 by the output of block 18.

The output of block 22 is coupled to comparator 26 through conductor 27. The comparator circuit has a constant input supplied to it at input 28. This input is the function R(V). R(V) is the ratio of the characteristic of two detectors 14 and 16 for fixed values of tube current and for variable values of tube potential with the same absorber 12. The comparator determines the point on the R(V) curve corresponding to the calculated ratio and this enables the automatic readout of the peak tube voltage shown at block 29 coupled to the comparator through conductor 31.

A generalized formulation for the response (S) of a radiation detector to diagnostic X-rays may be written as the following function:

$$S = f(V, I, T), \tag{1}$$

where radiation source to detector distance is constant, where V is the X-ray tube potential, I is the tube current, and T is the equivalent filtration thickness of the absorbing materials between the source (i.e., X-ray tube) and the detector. This function expresses the detector response for conditions of constant tube voltage and current. Where time-varying voltage and/or current waveforms are applied to the X-ray source, this function expresses the instantaneous response, and should be written as:

$$S(t) = f(V(t), I(t), T). \tag{2}$$

This is the most general form of the detector response function.

The equipment and system described herein provides a measurable function which is dependent only upon V and thus the value can be inferred from the measurement of the function.

A more detailed consideration of the three variables which affect detector response is thus in order and is as follows:

(1) In conventional diagnostic X-ray equipment, total equivalent radiation filtration ($F_T$) ranges from almost zero for certain mammography units ($F_{Tmin}$) to 5 mm aluminum or more ($F_{Tmax}$) for selected high voltage applications. In order to achieve a detector response function which is independent of the variation in $F_T$ between different X-ray machines, an additional radiation absorber F* must be interposed between the X-ray source and the detector.
Let $$\Delta F_T = F_{Tmax} - F_{Tmin}$$

The requirement: $F_{Tmin} + F^* \simeq F_{Tmax} + F^*$, i.e., $$F^* + \Delta F_T \simeq F^*. \tag{3}$$

The equivalent filtration thickness of the additional radiation absorber must thus be many times greater than $\Delta F_T$. If:

$$T = F_T + F^* \text{ and } F^* >> \Delta F_T \tag{4}$$

then $$S = f(V, I, F^*) \tag{5}.$$

Thus, for any value of F* meeting criterion (4), the function S is independent of the total filtration for any X-ray machine under test, and can be expressed as:

$$S = g_{F^*}(V, I). \tag{6}$$

(2) Except at low tube potentials (<50 kV), the radiation output of an X-ray generator is directly proportional to the X-ray tube current (voltage fixed). In turn, the response of a radiation detector operating below its intensity limit will be directly proportional to the radiation output produced at a fixed tube potential. As such:

$$g_{F^*}(V, I) = I \cdot h_{F^*}(V) \tag{7}$$

and hence $$S(t) = I(t) h_{F^*}(V(t)). \tag{8}$$

(3) The expression for detector response has now been reduced to the product of two one-dimensional functions. However, it is still not possible to determine V(t) from measurements of S(t) because $S(t) = I(t)h_{F^*}(V(t))$ is one equation in two unknowns. A second equation is needed.

Consider the case of two radiation detectors D1 and D2 represented by response functions S1 and S2 respectively, where $S1 \neq S2$. From equation (7), $$S1 = I \cdot h1_{F^*}(V) \tag{9A}$$

$$S2 = I \cdot h2_{F^*}(V). \tag{9B}$$

Then:

$$\frac{S1}{S2} = \frac{I \cdot h1_{F^*}(V)}{I \cdot h2_{F^*}(V)} = \frac{h1_{F^*}(V)}{h2_{F^*}(V)}. \tag{10}$$

Thus, a new function which depends only upon V can be defined:

$$R(V) \equiv \frac{h1_{F^*}(V)}{h2_{F^*}(V)} = \frac{S1}{S2} \tag{11}$$

$$V = R^{-1}(S1/S2). \tag{12}$$

An example of the three functions (S1, S2, R(V)) is shown graphically in FIG. 3. For time-varying signals:

$$R(V(t)) = \frac{S1(t)}{S2(t)}. \text{ Hence, at any} \tag{13}$$

Hence, at any time t during an X-ray exposure, the X-ray tube voltage can be inferred from the measured value of R. By logical extension, the peak tube potential can be determined from the ratio of the peak responses of the two detectors during an exposure.

$$V = V_p \text{ at } t = t_p \text{ for all detectors.}$$

Therefore:

$$\frac{S1(t_p)}{S2(t_p)} = R(V(t_p)) = R(V_p). \tag{14}$$

$$V_p = R^{-1}\frac{S1(t_p)}{S2(t_p)}. \tag{15}$$

The calibration of any device employing this method is thus obtained by an accurate determination of $H1_{F^*}(V)$ and $h2_{F^*}(V)$.

A constant potential X-ray generator whose voltage calibration is accurately known is used. For constant tube current $I_c$ and thick added absorber F*, S1 and S2 are measured as a function of tube voltage V. Then:

$$S1 = I_c \cdot h1_{F^*}(V) \quad h1_{F^*} = \frac{S1}{I_c}$$

$$S2 = I_c \cdot h2_{F^*}(V) \quad h2_{F^*} = \frac{S2}{I_c}$$

$$R(V) = \frac{h1_{F^*}(V)}{h2_{F^*}(V)}$$

With (R(V) calibrated for any X-ray generator, measured values of S1/S2 can be employed to determine V from the function R(V). In a working instrument, the function R(V) is stored in a storage means 39 and fed into comparator 26 through conductor 28.

From determinations of R(V(t)), the high voltage waveform V(t) can be reconstructed. However, once equations (9A) and (9B) have been solved for V(t), values can be determined for I(t) as well. The measured response of either detector can be used.

$$S1(t) = I(t) \cdot h1_{F^*}(V(t)) \tag{16}$$
$$I(t) = S1(t)/h1_{F^*}(V(t))$$

Also, since $I = I_p$ at $t = t_p$, $I_p = I(t_p) = S1(t_p)/h1_{F^*}(V(t_p))$.

Additionally, for an exposure of duration $t_{max}$, the following calculations are possible:

$$I_{avg} = \frac{\int_0^{t_{max}} I(t)\, dt}{t_{max}}.$$

$$I_{rms} = \frac{[\int_0^{t_{max}} I^2(t)\, dt]^{\frac{1}{2}}}{t_{max}}.$$

It was previously noted that the source-detector distance, a factor affecting the detector response function was assumed constant. For measurements of S1 and S2 at the same source-detector distance, the ratio S1/S2 and hence the value of V determined is independent of distance. However, use of the function $h_{F^*}$ to determine the tube current I depends upon a knowledge of the source-detector distances employed in the original calibration and in the measurement of interest.

Let: Source-detector distance = SDD
$S = f(V, I, T, SSD)$

Let $SDD_r$ be the reference value to which all measurements are compared, and $SDD_i$ be any other distance. Then:

$$S_i = S_r (SDD_r / SDD_i)^2.$$

$SDD_r$ represents the distance at which the calibration of the system is performed, i.e., $h1_{F^*}(V, SDD_r)$ and $h2_{F^*}(V, SDD_r)$. Therefore, the general expression for I(t) becomes:

$$I(t) = \frac{S1(t)}{h1_{F^*}(V(t))} \cdot \frac{(SDD_i)^2}{(SDD_r)^2}$$

The equipment of FIG. 1 determines the peak responses of each of the detectors $S1_p$ and $S2_p$ in blocks 17 and 18. The processor determines the ratio function of $S1_p$ divided by $S2_p$. The output of the comparator 26 provides the desired peak tube voltage.

The method and equipment described above is independent of the properties of the absorber but depends upon the properties of the radiation detectors. Thus, if the response of detector D1 is four times that of detector D2 at 60 kVp, and only two times greater at 100 kVp, it is this characteristic that is employed to determine the peak tube potential. Hence, the appropriate selection of detectors makes it possible for this method to be highly sensitive over large voltage ranges more expeditiously than would be accomplished by the previous method of the noted patent.

The method of U.S. Pat. No. 4,097,736 is technologically feasible if the multiplicity of detectors used are matched; that is, have the same response function. The present method can only be utilized if the response functions of the two detectors are independent. If:

$$S1 = kS2 \quad (k = \text{constant})$$

then:

$$R(V) = (S1/S2) = k,$$

rendering the ratio function useless.

Thus, it is not enough that the size of the detector responses be different, but that their variation with radiation energy must also be different. The greater the dissimilarity between the two detector response functions, the better the method will work. The only constraint is that the two functions must both change monotonically with X-ray tube potential, since only in this way can it be assured that the function R(V) is not degenerate; i.e., there are not two values $V_a$ and $V_b$ whereby $R(V_a) = R(V_b)$.

While the principles of the invention have been described above in connection with specific apparatus and applications, it is to be understood that this description is made by way of example only and not as a limitation on the scope of the invention.

I claim:

1. A radiation energy calibrating system for determining the voltage applied to a source of radiation, said calibrating system comprising a pair of radiation detectors operated responsive to the radiation output of the source for providing electrical signals that are a function of the radiation intensity, absorber means between said source and said detectors, means for determining the ratio between the electrical signals from each of said radiation detectors, and determining means responsive to the characteristics of each of said detectors and said ratio for determining the voltage applied to said source.

2. The radiation energy calibrating device of claim 1 wherein means are provided for calibrating said detector to determine the characteristics of each of said detectors.

3. The radiation energy calibrating system of claim 2 wherein said means for calibrating said detector comprises means for supplying a known voltage to said source at a constant current with the absorber means between the source and said detectors, means for converting the signals from the detector to voltage signals, means for determining the ratio between the voltage signals of said detectors, and said ratio being the calibrated characteristics of said detectors.

4. The radiation energy calibrating system of claim 3 wherein said determining means comprises means for comparing the calibrated characteristics of said detectors and the ratio of the voltage obtained from each of said detectors.

5. The radiation energy calibrating system of claim 1 including means for determining the peak voltage applied to a source radiation, said peak voltage determining means comprising means for detecting the peak voltages provided by each of said radiation detector means, means for determining the ratio between the peak voltages from each of said radiation detectors, and means responsive to the characteristics of each of said detectors and said ratio of peak voltages for determining the peak voltage applied to said source from the said ratio.

6. The radiation energy calibrating system of claim 5 including means for comparing the calibrated characteristics of said detectors and the ratio of the peak voltages obtained from each of said detectors.

7. A method of detecting the actual kV input to a radiation source when a varying voltage is applied to the source, said method comprising the steps of:

(a) absorbing given amounts of radiation energy from the source;
(b) detecting the radiation not absorbed by simultaneously detecting the radiation not absorbed with two unmatched radiation detectors;
(c) converting the detected radiation from each of the detectors to electrical signals,
(d) determining the ratio of those electrical signals,
(e) matching the ratio of the said signals to a ratio of predefined characteristics of the detectors to thereby determine the actual kV input known values of tube voltage.

8. The method of claim 7 including the steps of:
(a) detecting the peak electrical signals provided by each of said detectors,
(b) determining the ratio of the peak electrical signals, and
(c) matching the ratio of the peak electrical signals to the ratio of predefined characteristics of the detectors to thereby obtain the actual kV peak input.

* * * * *